United States Patent [19]

Chida et al.

[11] Patent Number: 5,487,786
[45] Date of Patent: Jan. 30, 1996

[54] PLASMA CHEMICAL VAPOR DEPOSITION DEVICE CAPABLE OF SUPPRESSING GENERATION OF POLYSILANE POWDER

[75] Inventors: Atsushi Chida, Nara; Hitoshio Sannomiya, Osaka; Katsuhiko Nomoto, Kashiwara; Hiroshi Okamoto; Yoshihiro Yamamoto, both of Nara, all of Japan

[73] Assignee: Sharp Kabushiki Kaisha, Osaka, Japan

[21] Appl. No.: 363,226

[22] Filed: Dec. 22, 1994

[30] Foreign Application Priority Data

Dec. 24, 1993 [JP] Japan .................................. 5-326639
Aug. 4, 1994 [JP] Japan .................................. 6-183265

[51] Int. Cl.⁶ .................................................. C23C 16/00
[52] U.S. Cl. ........................... 118/723 E; 204/298.09; 118/724; 118/725
[58] Field of Search ............... 156/345; 118/72 E, 118/724, 725; 204/298.06, 298.09, 298.35

[56] References Cited

U.S. PATENT DOCUMENTS

| | | | |
|---|---|---|---|
| 5,085,750 | 2/1992 | Soraoka | 204/192.32 |
| 5,290,758 | 3/1994 | Wordenweber | 505/1 |
| 5,324,360 | 6/1994 | Kozuka | 118/719 |
| 5,336,326 | 8/1994 | Kamer | 118/723 HC |
| 5,348,587 | 9/1994 | Eichman | 118/723 MP |
| 5,364,481 | 11/1994 | Sasaki | 118/718 |
| 5,366,555 | 11/1994 | Kelly | 118/719 |
| 5,417,834 | 5/1995 | Latz | 204/298.11 |

FOREIGN PATENT DOCUMENTS

| | | |
|---|---|---|
| 0095887 | 12/1983 | European Pat. Off. . |
| 0301604 | 2/1989 | European Pat. Off. . |
| 61-13616 | 1/1986 | Japan . |
| 62-103372 | 5/1987 | Japan . |
| 2-7421 | 1/1990 | Japan . |
| 2-54922 | 2/1990 | Japan . |

OTHER PUBLICATIONS

*Patent Abstracts of Japan*, vol. 008, No. 059 (E-232) Mar. 17, 1984, corresponding to Japanese Patent Publication No. 58-209110.

*Primary Examiner*—R. Bruce Breneman
*Assistant Examiner*—Juni Y. Chang
*Attorney, Agent, or Firm*—Morrison & Foerster

[57] ABSTRACT

There is provided a plasma CVD device which can deposit a high-quality a-Si:H or other film at a high rate, and which can improve production efficiency thereof remarkably. The CVD device has a substrate holding electrode and a high frequency application electrode arranged opposite to and parallel to a substrate held by the substrate holding electrode. A material gas introduced between the substrate holding electrode and the high frequency application electrode is decomposed by glow discharge, so that a thin film is deposited on the heated substrate. A first electrode heater for heating a peripheral portion of the high frequency application electrode is installed along the peripheral portion of the high frequency application electrode. A second electrode heater for heating the peripheral portion of the high frequency application electrode and a surface of the high frequency application electrode opposite to its surface facing the substrate is composed of a bottom portion and a side portion provided uprightly along a peripheral edge of the bottom portion and formed in a concave shape to surround the high frequency application electrode with a spacing therebetween.

5 Claims, 6 Drawing Sheets

PLASMA CHEMICAL VAPOR DEPOSITION DEVICE CAPABLE OF SUPPRESSING GENERATION OF POLYSILANE POWDER

BACKGROUND OF THE INVENTION

1. Field of the Invention

The present invention relates to a plasma CVD (Chemical Vapor Deposition) device used to deposit thin films of hydrogenated amorphous silicon and the like on a substrate.

2. Description of the Prior Art

Generally, hydrogenated amorphous silicon (hereinafter, expressed as a-Si:H) in which silicon atoms and hydrogen have been bonded together is deposited on a substrate of a glass plate or the like laminated with a metal or other electrical conductors or transparent electrically conductive films, for applications to solar cells, photoconductive drums, various sensors, thin film transistors, and the like. As the method of depositing a-Si:H onto the substrate, available are the plasma CVD process using glow discharge, the reactive sputtering process, and the like. Among others, the plasma CVD process is widely adopted as the process for fabricating a-Si:H films by virtue of its capability of depositing a-Si:H thin films having excellent film characteristics.

The plasma CVD device used for carrying out the plasma CVD process has an electrode for holding the substrate and a high frequency application electrode arranged opposite to and parallel to the electrode. In the plasma CVD device, when high frequency power is applied between the two electrodes, glow discharge is generated. A material gas is previously introduced between the two electrodes. The introduced material gas is decomposed by the glow discharge, so that an a-Si:H film is deposited on 10 the substrate held by the electrode.

In such a plasma CVD device, generally, an a-Si:H film is deposited with RF (radio frequency) power set as low as 0.05 W/cm$^2$ so that the film forming rate will be around 0.5 to 2 Å/sec under the conditions of a 0.1–0.3 Torr film forming pressure and an around 200° C. substrate temperature. The a-Si:H film fabricated in this way, when not doped, shows good characteristic values including an optical band gap of around 1.7 eV, a photoconductivity of around $1\times10^{-4}$ S/cm, and a dark conductivity of around $1\times 10^{-10}$ S/cm.

When an a-Si:H film is deposited on the substrate by the plasma CVD device, it is practically preferable to fabricate the film at the fastest possible rate under such conditions that a photoconductivity of $1\times10^{-5}$ S/cm or more, at which fabricated a-Si:H films show less deterioration of characteristics, can be obtained. That is, the faster the film forming rate is, the more the fabrication time of a-Si:H films can be reduced so that the production efficiency is improved. As a result, the fabrication cost of the a-Si:H films can be reduced. For this purpose, the film forming rate is desirably 2 Å/sec or more, preferably 10 Å/sec or more.

For example, a solar cell of the p-i-n structure, which is fabricated by depositing a-Si:H films on a substrate, has a large thickness of an i layer as much as 5000 Å relative to 100–300 Å thick p and n layers. Accordingly, the film forming rate of the i layer is desirably 10 or more times faster than the film forming rate of the p and n layers.

To increase the film forming rate by the plasma CVD device, it is necessary to set a high frequency power supply to high power, as well as to heighten the flow rate of material gas within a deposition chamber. However, if the material gas is fed at such a high flow rate while the high frequency power supply is set to high power, polysilane powder would be generated in plasma at low-temperature part in the deposition chamber. This leads to a problem that the generated polysilane powder would be deposited on peripheral portions of the high frequency application electrode and the side and bottom faces of the deposition chamber surrounding the high frequency application electrode. Since the density of reaction gas is relatively high at a low-temperature part and its vicinities in the deposition chamber, the material gas is fed at high flow rate such that with a high-power high frequency power applied, SiH$_2$ radicals that have been generated in the reaction gas will react to be polymerized with SiH$_4$ molecules. The polymerization reaction proceeds in a chain-reaction fashion, causing the generation of powder. The generated powder will be deposited on the low-temperature part and its proximate peripheries of the high frequency application electrode, and on the side and bottom faces of the deposition chamber surrounding the high frequency application electrode.

If the polysilane powder is deposited in a large amount, the a-Si:H film will no longer be deposited uniformly while the ratio of Si-H$_2$ bond in the resulting a-Si:H film increases because high-order silane radicals are involved in the film growth. This would incur a decrease in the photoconductivity, an increase in defect density, and the like, making it difficult to obtain a target high-quality film.

The polysilane powder, if sucked into an exhaust system, may cause the pump to decrease in its exhaust ability or to come into some malfunction. Therefore, when powder is deposited in the deposition chamber, the powder must be cleaned and removed. For removal of the powder, the film formation work must be interrupted so that the deposition chamber is turned back to normal temperature, and moreover the interior of the deposition chamber must be opened to the air. The interruption of the film formation work necessitates such processes as heating the deposition chamber and evacuating the interior of the deposition chamber for the restart of the film formation work. As a result, the availability of the plasma CVD device decreases to a considerable extent such that the advantage of high film forming rate could not be obtained.

For these and other reasons, as it stands, a-Si:H films are deposited at a film forming rate as low as 0.5–2 Å/sec, with a low flow rate of material gas and moreover with a high frequency low power.

SUMMARY OF THE INVENTION

The present invention has been developed with a view to substantially solving the above described disadvantages and has for its essential object to provide a plasma CVD device which can deposit thin films such as a-Si:H films having successful characteristics at high speed and yet which remarkably improves production efficiency.

In order to achieve the aforementioned object, the present invention provides a plasma CVD device having within a deposition chamber:

a substrate holding electrode for holding a substrate;

a high frequency application electrode arranged opposite to and parallel to the substrate held by the substrate holding electrode;

a high frequency power supply for applying high frequency power to the high frequency application electrode; and a substrate heater for heating the substrate held by the substrate holding electrode, wherein a material gas introduced between the substrate holding electrode and the high frequency application electrode is decomposed by glow discharge generated by a high frequency power applied between the two electrodes, so that a thin film is deposited on the heated substrate, the plasma CVD device comprising:

a first electrode heater installed along a peripheral portion of the high frequency application electrode, and heating the peripheral portion of the high frequency application electrode; and a second metallic electrode heater which is composed of a bottom portion and a side portion provided uprightly along a peripheral edge of the bottom portion and formed into a concave shape in section, and which surrounds the high frequency application electrode with a spacing therebetween, and which heats a surface of the high frequency application electrode opposite to its surface facing the substrate as well as the peripheral portion of the high frequency application electrode.

In the above-described plasma CVD device, a peripheral portion of the high frequency application electrode, which is the low-temperature part within the deposition chamber, is heated by the first electrode heater and a side portion of the second metallic electrode heater up to, for example, 100° C. or higher, so that gas density of the low-temperature part and its vicinities is decreased. As a result, for example when an a-Si:H film is deposited, $SiH_2$ radicals that have been generated at the low-temperature part in the deposition chamber are suppressed from being polymerized with $SiH_4$ molecules, whereby the generation of polysilane powder in plasm is suppressed. Accordingly, the ratio of $SiH_2$ bond in the film decreases, and the photoconductivity improves. Defect density of the film also decreases so that a high quality film can be obtained. Consequently, the film can be deposited at high speed with the material gas fed at a high flow rate and with the high frequency power set to high.

When the high frequency application electrode is quadrangle-shaped, intense discharge is likely to occur at four corner portions so that polysilane powder is likely to be generated at those portions. Thus, in the plasma CVD device according to an embodiment of the present invention, the high frequency application electrode is formed into a generally rectangular plate-like shape rounded at its four corners. Correspondingly, the first electrode heater is curved at the four corners along the shape of the high frequency application electrode. The bottom portion of the second metallic electrode heater has a size larger than the size of the high frequency application electrode, and is formed into a generally rectangular plate-like shape rounded at its four corners. Correspondingly, the side portion of the second metallic electrode heater is formed into a square cylinder rounded at corners. By forming the high frequency application electrode and the like into a shape having no sharp corners in this way, discharge at the periphery of the high frequency application electrode is suppressed, so that the powder is unlikely to be deposited at the periphery.

Also, in the plasma CVD device according to an embodiment of the present invention, the high frequency application electrode is formed into a disc shape. Correspondingly, the first electrode heater is formed into a circular shape along the shape of the high frequency application electrode. Also, the bottom portion of the second metallic electrode heater is formed into a disc shape having a size larger than the size of the high frequency application electrode. Correspondingly, the side portion of the second metallic electrode heater is formed into a cylindrical shape. By forming the high frequency application electrode and the like into a circular shape, the discharge at the periphery of the high frequency application electrode is further suppressed, so that powder is unlikely to be deposited at the periphery.

Also, in the plasma CVD device according to an embodiment of the present invention, since a thin film of a-Si:H is deposited on the substrate, an a-Si:H film exhibiting successful characteristic values can be obtained.

Also, in the plasma CVD device according to an embodiment of the present invention, since the first electrode heater and the second metallic electrode heater heat the object each to 100° C. or higher, generation of polysilane powder at the four corners of the high frequency application electrode is suppressed more effectively when the a-Si:H thin film is deposited on the substrate.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The plasma CVD device of the present invention is now described in more detail by way of embodiments thereof.

Figure 1:
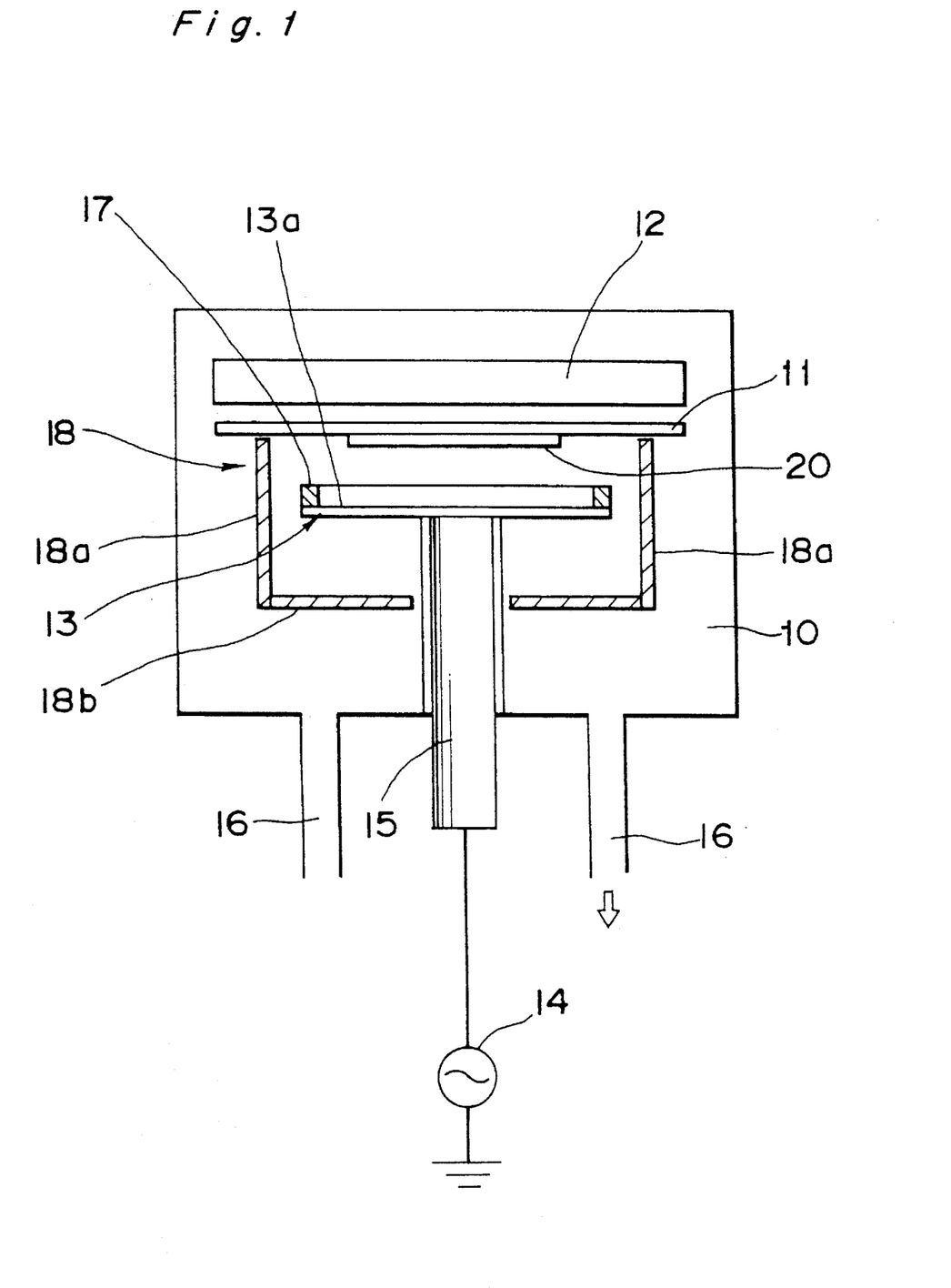
FIG. 1 is a vertical sectional view showing construction of a plasma CVD device which is an embodiment of the present invention.

FIG. 1 is a side outline view showing an example of a plasma CVD device of the present invention. Within a deposition chamber 10, a substrate holding electrode 11 for holding a substrate 20 on which, for example, an a-Si:H film is to be deposited is arranged in a horizontal state, and the substrate 20 is held on the lower face of the substrate holding electrode 11. Above the substrate holding electrode 11, a substrate heater 12 for heating the substrate 20 held by the substrate holding electrode 11 is disposed in a horizontal state.

Below the substrate holding electrode 11, a high frequency application electrode 13 to which high frequency power from a high frequency power supply 14 is applied is positioned horizontal and parallel to the substrate holding electrode 11, so as to be opposed to the substrate 20 held by the substrate holding electrode 11. Below the high frequency application electrode 13, a material gas inlet tube 15 for introducing a material gas is arranged in a vertical state. For example, $SiH_4$ and dilution gas $H_2$ are introduced into the material gas inlet tube 15. The high frequency application electrode 13 is provided with a multiplicity of small holes (not shown) through which the material gas introduced from the material gas inlet tube 15 is allowed to pass.

A plurality of exhaust tubes 16 are coupled with the bottom face of the deposition chamber 10. Connected to each exhaust tube 16 is an unshown exhaust system composed of a rotary pump, a mechanical booster pump, a turbo-molecular pump, a pressure-control valve, and the like. The deposition chamber 10 is adjusted to a desired internal pressure by the exhaust system.

The material gas is adjusted to a desired flow rate by an unshown mass-flow controller and introduced into the deposition chamber 10 from the material gas inlet tube 15 through the small holes (not shown) provided in the high frequency application electrode 13. The material gas introduced into the deposition chamber 10 flows in between the substrate holding electrode 11 and the high frequency application electrode 13. In such a state, glow discharge is effected between the two electrodes 11 and 13 by a high frequency voltage applied from the high frequency power supply 14. Then, the material gas is decomposed by the glow discharge, and deposited on the substrate 20.

Figure 2:
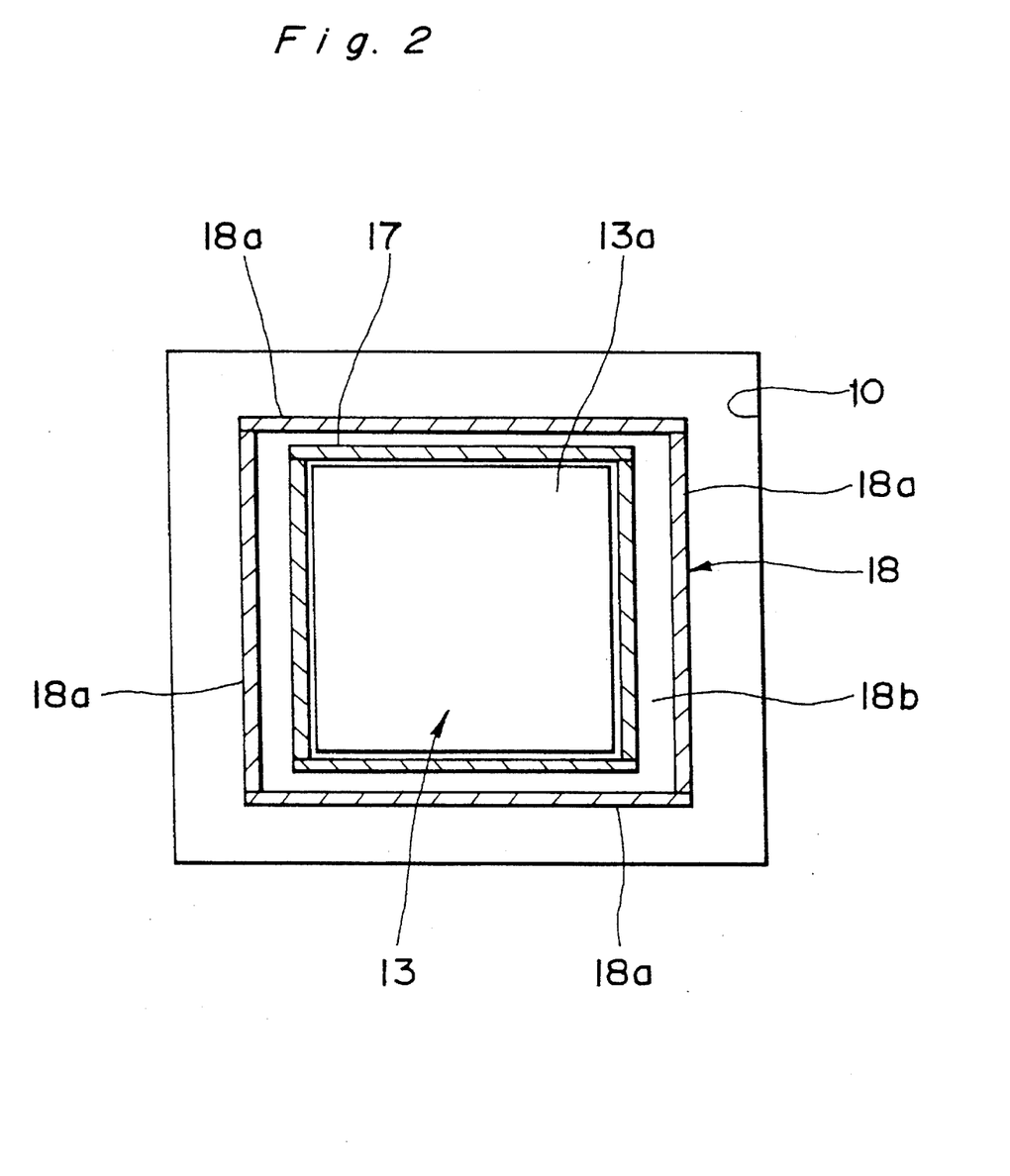
FIG. 2 is a horizontal sectional view of the deposition chamber of the plasma CVD device.

FIG. 2 is a schematic plan sectional view of the deposition chamber 10. The high frequency application electrode 13 has a 20 cm square cathode plate 13a and is formed into a rectangular plate-like shape as a whole. A first electrode heater 17 with a sheath heater attached to the ground shield is provided on the peripheral edge of the cathode plate 13a. The first electrode heater 17 is strip shaped, and arranged along the entire peripheral edge of the cathode plate 13a.

A second metallic electrode heater 18 composed of a metal plate and a sheath heater wound around the exterior of the metal plate is arranged around the high frequency application electrode 13. The electrode heater 18, as shown in FIG. 1, is formed of a sheet of plate 18b serving as the bottom portion, and four sheets of plate 18a serving as the side portion provided uprightly along the peripheral edge of the plate 18b, into a hollow rectangular-parallelopiped structure whose top face is opened. The plate 18a forming the side portion of a upright state of the second metallic electrode heater 18 is arranged about 1 to 3 cm apart from the peripheral edge of the cathode plate 13a of the high frequency application electrode 13. The top ends of these four sheets of plate 18a are put into an about 5 mm proximity to the substrate holding electrode 11.

The one sheet of plate 18b forming the bottom portion of the electrode heater 18 is arranged horizontal about 1 to 3 cm downward apart from the lower face of the cathode plate 13a. The material gas inlet tube 15 is inserted and passed through a center portion of the plate 18b with a slight clearance (1 cm or so) opened, where the clearance around the material gas inlet tube 15 serves as a suction hole for the material gas. Each plate 18a, 18b constituting the electrode heater 18 is removable from the deposition chamber 10.

The sheath heaters of the electrode heater 17 and the electrode heater 18 each can be adjusted to any arbitrary temperature by a temperature adjustor (not shown) using on-off control. It is adjusted to a temperature of 100° C. or higher, preferably 150° C. or higher, and more preferably 200° C. or higher, for the formation of an a-Si:H film.

A method for fabricating an a-Si:H film by the plasma CVD device of the above arrangement is now described below.

The substrate 20 mounted onto the substrate holding electrode 11 is placed within the deposition chamber 10, and the chamber is evacuated to a high vacuum as much as $5 \times 10^{-6}$ Torr by the unshown rotary pump, mechanical booster pump, and turbo-molecular pump of the exhaust system. Thereafter, the material gas $SiH_4$ and the dilution gas $H_2$ are introduced from the material gas inlet tube 15 into the deposition chamber 10 at flow rates of 150 sccm and 50 sccm, respectively. Then the internal pressure of the deposition chamber 10 is controlled to about 0.3 Torr by a pressure control valve (not shown) of the exhaust system. Subsequently, a high frequency power with density 0.15 W/cm$^2$ is applied to the high frequency application electrode 13, whereby a glow discharge is generated between the high frequency application electrode 13 and the substrate holding electrode 11.

At the time, the substrate 20 held by the substrate holding electrode 11 has been heated to 200° C. by the substrate heater 12. Also, the peripheral edge of the cathode plate 13a of the high frequency application electrode 13 has been heated to 100° C. or higher (to 100° C. in this example) by the electrode heater 17. Further, the lower face and peripheral portions of the high frequency application electrode 13 have been heated to 100° C. or higher (to 100° C. in this example) by the electrode heater 18.

The $SiH_4$ and $H_2$ material gases introduced from the material gas inlet tube 15 into the deposition chamber 10 are decomposed by the glow discharge generated between the substrate holding electrode 11 and the high frequency application electrode 13, and an a-Si:H film is formed on the substrate 20.

Figure 3:
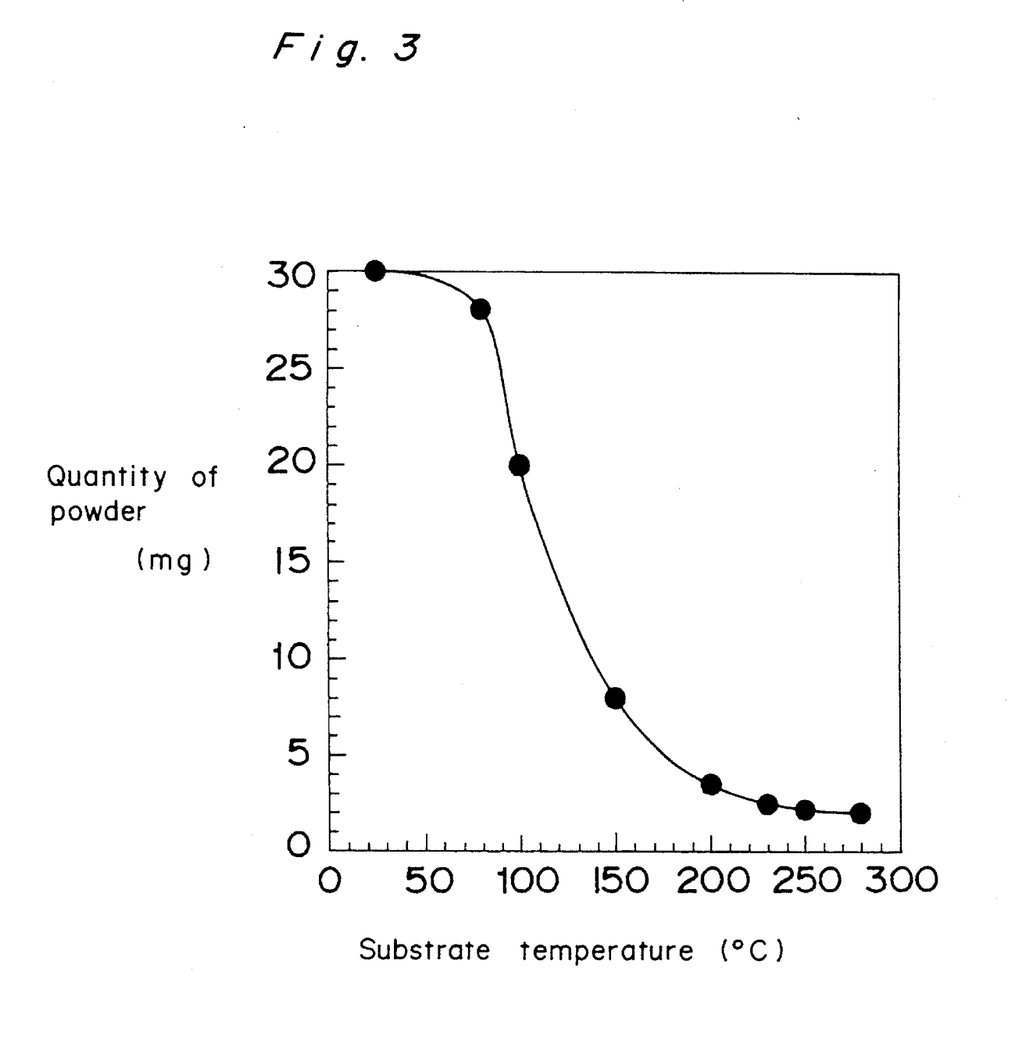
FIG. 3 is a graph showing variation in the amount of polysilane powder generated when a substrate temperature is varied during the process of forming an a-Si:H film by the plasma CVD device.
Figure 4A:
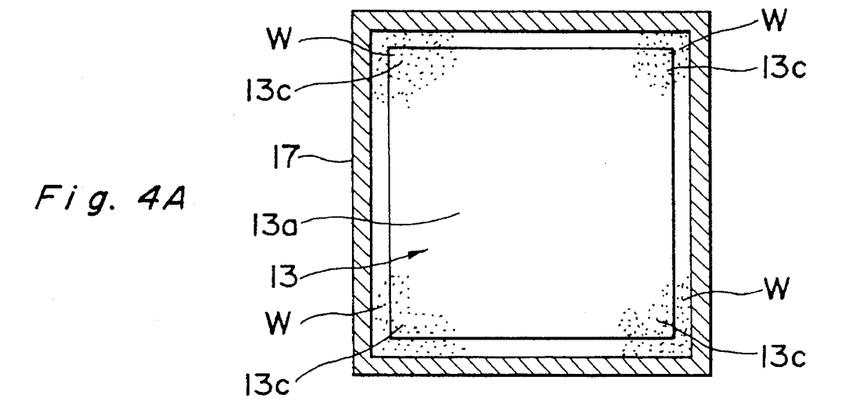
FIGS. 4A, 4B, 4C are views showing the shape of a high frequency application electrode and the like and the amount of polysilane powder generated, in the plasma CVD device of the present invention.

FIG. 3 is a graph showing variation in the amount of polysilane powder generated in the deposition chamber 10 when the temperature of the electrode heater 17 and the electrode heater 18 is varied by the on-off control temperature adjustor in the process of forming an a-Si:H film by the plasma CVD device. More precisely, the figure shows the amount of polysilane powder W generated at four corners 13c of the high frequency application electrode 13 as shown in FIG. 4A. As understood from FIG. 3, the amount of powder generated will remain almost unchanged with increasing substrate temperature when the substrate temperature is within a range of room temperature to around 100° C. However, with the substrate temperature above 100° C., as the substrate temperature increases, the amount of powder generated decreases. This is because the polymerization reaction of $SiH_2$ radicals and $SiH_4$ molecules at the low-temperature part of the deposition chamber is suppressed with increasing temperature, so that polysilane powder is suppressed from being generated in the plasma. Accordingly, the generation of polysilane powder can be effectively suppressed by heating the high frequency application electrode 13 and its peripheries to 100° C. or higher, preferably 150° C. or higher, more preferably 200° C. or higher with the electrode heater 17 and electrode heater 18.

This plasma CVD device proved to be able to deposit an a-Si:H film at a rate of 10.3Å/sec, which is 10 to 20 times higher than the ordinary film forming rate. The a-Si:H film obtained by the plasma CVD device of the present invention showed successful film characteristics such as an optical band gap of 1.75 eV, a photoconductivity of $4.6 \times 10^{-5}$ S/cm, a dark conductivity of $8.2 \times 10^{-11}$ S/cm, and a ratio of Si-H$_2$ bond in the film of 4.1%.

In this plasma CVD device, the electrode heater 18 is composed of five removable sheets of plate 18a, 18b. Therefore, even when the polysilane powder has deposited onto the plates 18a, 18b in a film state, the powder can be easily removed from the plates 18a, 18b by removing the plates 18, 18b from the deposition chamber 10 and cleaning 10 them. Still, since the generation of polysilane powder is suppressed by heating with the electrode heater 17 and the electrode heater 18, the number of working times for removing powder is reduced remarkably. Thus, the number of times of opening the deposition chamber 10 is also reduced remarkably to smaller than in the conventional plasma CVD device. As a result, the device availability is improved and the productivity is considerably improved. Further, since the electrode heater 17 is removable from the cathode plate 13a by removing screws (not shown) for attachment, the polysilane powder can be removed more easily from the periphery of the cathode plate 13a.

Peripheral portions of the high frequency application electrode 13 inside the electrode heater 18 covered with the plates 18a, 18b are reduced in pressure uniformly to a specified vacuum state by the clearances around the material gas inlet tube 15 inserted and passed through the center of the plate 18b disposed at the bottom. Accordingly, dispersion in the distribution of the film thickness of an a-Si:H film deposited on the substrate 20 can be reduced.

The relative distance between the substrate holding electrode 11 and the high frequency application electrode 13 can be adjusted by an unshown slide mechanism. Besides, the electrode heater 18 is also movable in the vertical direction. As an example, the distance between the cathode plate 13a and the substrate holding electrode 11 is 30 mm, and the distance between the electrode heater 18 and the substrate holding electrode 11 is not longer than 10 mm.

In addition, the above-described structure of the electrode heater 17 and the electrode heater 18 of the plasma CVD device is only an example, and not particularly limited only if it can heat objects to 100° C. or higher. The electrode heater 17 is only required to be of such an arrangement as will not hinder the plasma generated from the high frequency application electrode 13. Also, the electrode heater 18 does not necessarily need to be composed of the plates 18a, 18b having a sheath heater provided on the metal plate, and may be of other heat-generating systems.

Next, a modification of the plasma CVD device is described below.

Figure 5:
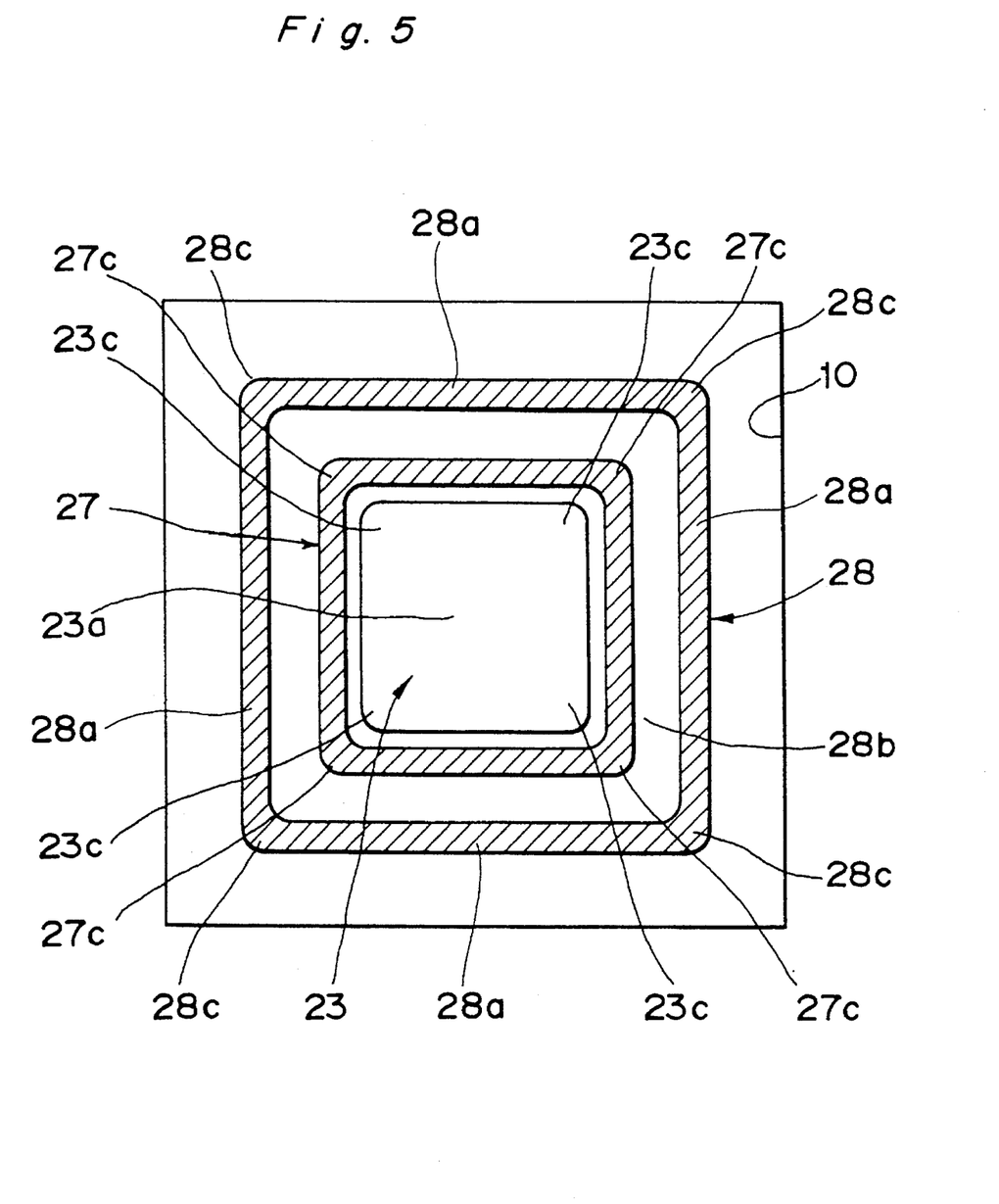
FIG. 5 is a view showing a modification of the plasma CVD device shown in FIGS. 1 and 2.

As shown in FIG. 4A, polysilane powder is more likely to be generated at the four corners 13c, where an intense discharge will easily occur, than at the center portion of the high frequency application electrode 13. Therefore, to suppress the discharge at the four corners, this plasma CVD device has within the deposition chamber 10 a high frequency application electrode 23 which is formed into a generally rectangular plate shape rounded at its four corners 23c, as shown in FIG. 5. Correspondingly, a first electrode heater 27 is curved at four corners 27c along the shape of the high frequency application electrode 23. Also, a bottom portion 28b of a second electrode heater 28 has a size larger than the size of the high frequency application electrode 23, and is formed into a generally rectangular plate shape rounded at its four corners 28c. Correspondingly, side portions 28a of the second electrode heater 28 are formed into a square cylinder rounded at corners. The other components are the same as shown in FIGS. 1 and 2. FIGS. 1 and 2 are also used here for reference of those components.

Now the operation of this plasma CVD device is described. The same components as shown in FIG. 1 are designated by the same reference numerals as in FIG. 1. A substrate 20 mounted on a substrate holding electrode 11 is placed within a deposition chamber 10. The deposition chamber is evacuated to a high vacuum as much as about $5 \times 10^{-6}$ Torr by unshown rotary pump, mechanical booster pump, and turbo-molecular pump of an exhaust system. Thereafter, material gas $SiH_4$ and dilution gas $H_2$ are introduced from the material gas inlet tube 15 into the deposition chamber 10 at flow rates of 150 sccm and 50 sccm, respectively. Then the internal pressure of the deposition chamber 10 is controlled to about 0.3 Torr by a pressure control valve (not shown) of the exhaust system. Subsequently, a high frequency power with density 0.15 W/cm² is applied to the high frequency application electrode 23, whereby a glow discharge is generated between the high frequency application electrode 23 and the substrate holding electrode 11.

At this time, the substrate 20 held by the substrate holding electrode 11 has been heated to 200° C. by a substrate heater 12. Also, the peripheral edge of a cathode plate 23a of the high frequency application electrode 23 have been heated to 100° C. or higher (to 100° C. in this example) by an electrode heater 27. Further, the lower face and peripheral portions of the high frequency application electrode 23 have been heated to 100° C. or higher (to 100° C. in this example) by an electrode heater 28.

The $SiH_4$ and $H_2$ material gases introduced from the material gas inlet tube 15 into the deposition chamber 10 are decomposed by a glow discharge generated between the substrate holding electrode 11 and the high frequency application electrode 23, and an a-Si:H film is formed on the substrate 20.

Figure 4B:
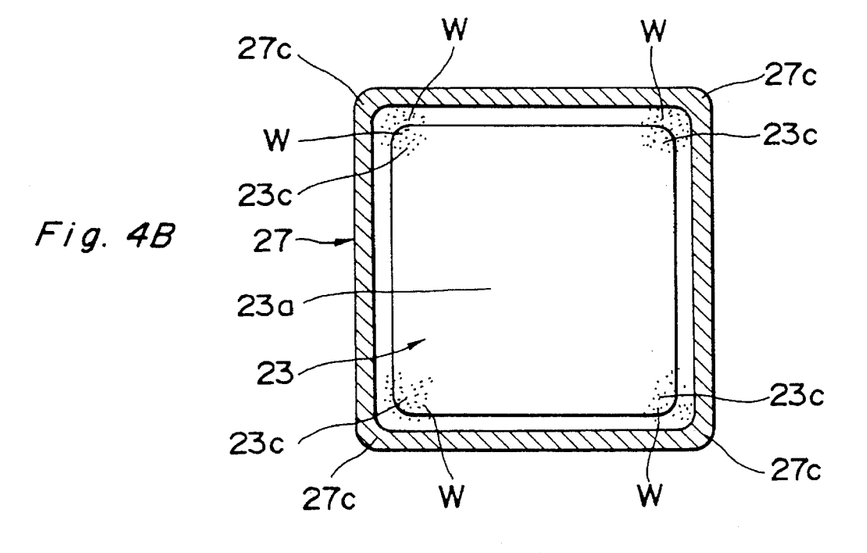

In this plasma CVD device, since the high 10 frequency application electrode 23 and the like is formed into a shape having no sharp corners, discharge at the four corners 23c of the high frequency application electrode 23 is suppressed. Accordingly, as shown in FIG. 4B, the amount of polysilane powder W generated at the four corners 23c of the high frequency application electrode 23 can be reduced.

This plasma CVD device proved to be able to deposit an a-Si:H film at a rate of 11.5 Å/sec, which is 10 to 20 times higher than ordinary film forming rate. Also, the a-Si:H film obtained by the plasma CVD device of the present embodiment showed successful film characteristics including an optical band gap of 1.73 eV, a photoconductivity of $4.9 \times 10^{-5}$ S/cm, a dark conductivity of $8.1 \times 10^{-11}$ S/cm, and a ratio of Si—$H_2$ bond in the film of 2.4%.

Next, a further modification of the plasma CVD device is described.

Figure 6:
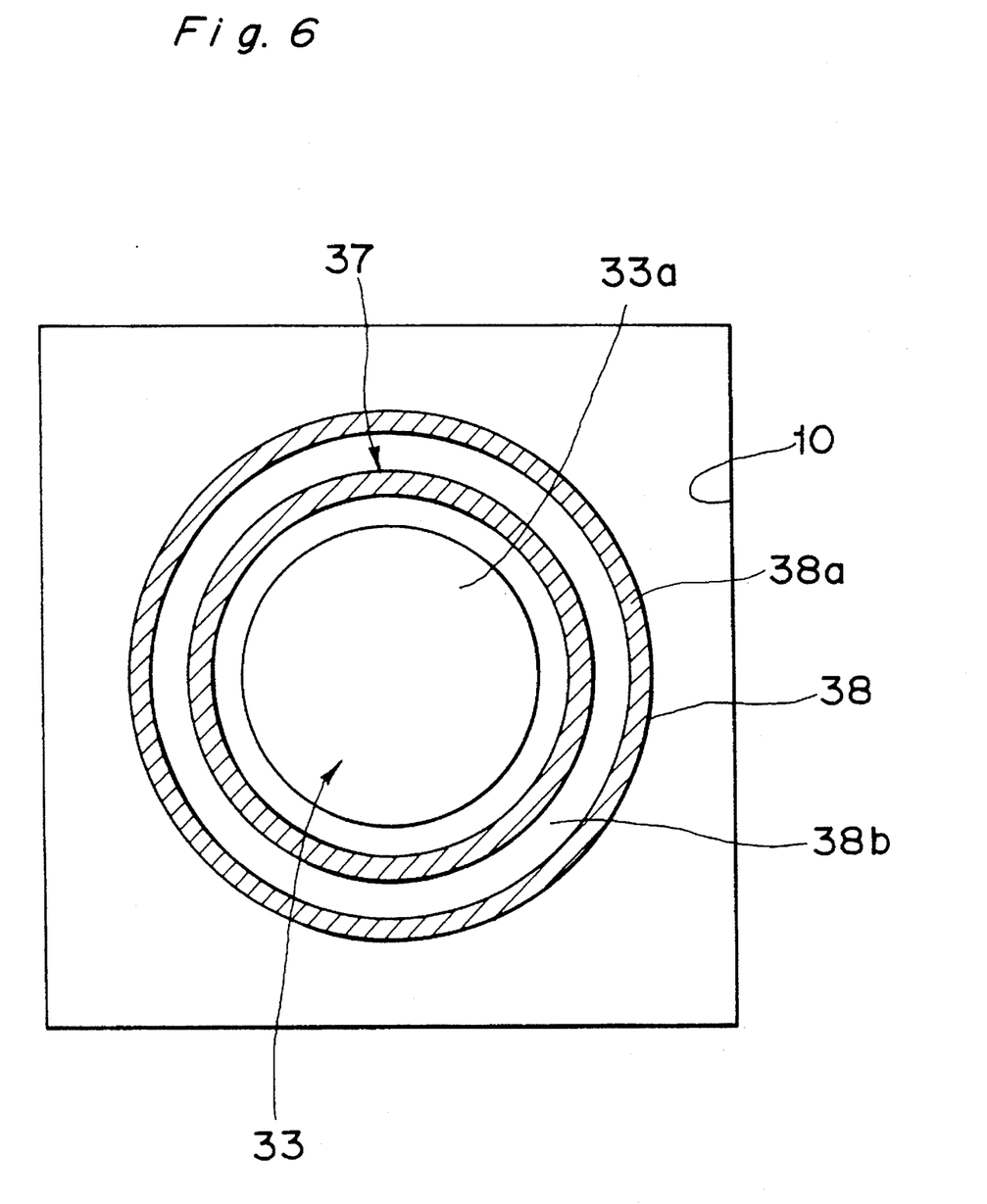
FIG. 6 is a view showing a further modification of the plasma CVD device shown in FIGS. 1 and 2.

As shown in FIG. 6, this plasma CVD device is provided with a high frequency application electrode 33 formed into a disc shape. Correspondingly, a first electrode heater 37 is formed into a circular shape along the shape of the high frequency application electrode 33. Also, a bottom portion 38b of a second electrode heater 38 is formed into a disc shape having a size larger than the size of the high frequency application electrode 33. Correspondingly, a side portion 38a of the second electrode heater 38 is formed into a cylindrical shape. The other components are the same as shown in FIGS. 1 and 2. FIGS. 1 and 2 are also used here for reference of those components.

Now the operation is described by using the same reference numerals as in FIG. 1. A substrate 20 mounted on a substrate holding electrode 11 is placed within a deposition chamber 10. The deposition chamber is evacuated to a high vacuum as much as about $5 \times 10^{-6}$ Torr by unshown rotary pump, mechanical booster pump, and turbo-molecular pump of an exhaust system. Thereafter, material gas $SiH_4$ and dilution gas $H_2$ are introduced from the material gas inlet tube 15 into the deposition chamber 10 at flow rates of 150 sccm and 50 sccm, respectively. Then the internal pressure of the deposition chamber 10 is controlled to about 0.3 Torr by a pressure control valve (not shown) of the exhaust system. Subsequently, a high frequency power with density 0.15 W/cm$^2$ is applied to the high frequency application electrode 33, whereby a glow discharge is generated between the high frequency application electrode 33 and the substrate holding electrode 11.

At this time, the substrate 20 held by the substrate holding electrode 11 has been heated to 200° C. by a substrate heater 12. Also, the peripheral edge of a cathode plate 33a of the high frequency application electrode 33 has been heated to 100° C. or higher (to 100° C. in this example) by an electrode heater 37. Further, the lower face and peripheral portions of the high frequency application electrode 33 have been heated to 100° C. or higher (to 100° C. in this example) by an electrode heater 38.

The SiH$_4$ and H$_2$ material gases introduced from the material gas inlet tube 15 into the deposition chamber 10 are decomposed by a glow discharge generated between the substrate holding electrode 11 and the high frequency application electrode 33, and an a-Si:H film is formed on the substrate 20.

Figure 4C:
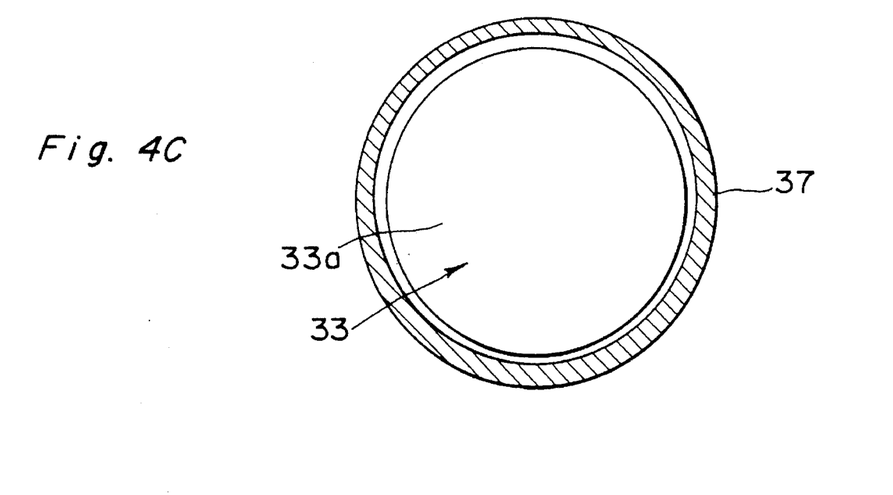

In this plasma CVD device, since the high frequency application electrode 33 and the like are formed into a circular shape, plasma is generated uniformly on the high frequency application electrode 33, so that such discharge at the corners in FIGS. 4A and 4B is suppressed. Accordingly, as shown in FIG. 4C, generation of polysilane powder at the periphery of the high frequency application electrode 33 can be suppressed substantially completely. If pulse discharge is performed in combination in this plasma CVD device, the generation of powder can be suppressed more effectively.

This plasma CVD device proved to be able to deposit a-Si:H films at a film forming rate of 12.4 Å/sec, which is 10 to 20 times higher than ordinary film forming rate. Also, the a-Si:H film obtained by the plasma CVD device of the present invention showed successful film characteristics including an optical band gap of 1.72 eV, a photoconductivity of $5.1 \times 10^{-5}$ S/cm, a dark conductivity of $7.6 \times 10^{-11}$ S/cm, and a ratio of Si—H$_2$ bond in the film of 1.1%.

As apparent from the above description, since the peripheral portions of the high frequency application electrode, which is the low-temperature part in the deposition chamber, is heated to, for example, 100° C. or higher by the first electrode heater and a side portion of the second metallic electrode heater, powder generation at the peripheral portion of the high frequency application electrode is suppressed. As a result, the ratio of Si—H$_2$ bond in the film is decreased, whereby the photoconductivity can be improved. Besides, the defect density can also be decreased, so that a high-quality film can be obtained. Accordingly, the film can be deposited at high speed with material gas fed at a high flow rate and with high frequency power set to high, whereby the production efficiency of products can be improved remarkably.

In the plasma CVD device of an embodiment of the present invention, since the high frequency application electrode and the like are formed into a shape having no sharp corners, discharge at the periphery of the high frequency application electrode can be suppressed, whereby powder generation at the periphery can be suppressed.

In the plasma CVD device of an embodiment of the present invention, since the high frequency application electrode and the like are formed into a circular shape, discharge at the periphery of the high frequency application electrode can be further suppressed, whereby powder generation at the periphery can be suppressed.

In the plasma CVD device of an embodiment of the present invention, since an a-Si:H film is deposited on the substrate, an a-Si:H film exhibiting successful characteristic values can be obtained.

In the plasma CVD device of an embodiment of the present invention, since heating temperature at the high frequency application electrode by the first electrode heater and the second metallic electrode heater is 100° C. or higher, generation of polysilane powder at the four corners of the high frequency application electrode is suppressed more effectively.

The invention being thus described, it will be obvious that the same may be varied in many ways. Such 10 variations are not to be regarded as a departure from the spirit and scope of the invention, and all such modifications as would be obvious to one skilled in the art are intended to be included within the scope of the following claims.

What is claimed is:

1. A plasma CVD device having within a deposition chamber:

a substrate holding electrode for holding a substrate;

a high frequency application electrode arranged opposite to and parallel to the substrate held by the substrate holding electrode;

a high frequency power supply for applying high frequency power to the high frequency application electrode; and a substrate heater for heating the substrate held by the substrate holding electrode, wherein a material gas introduced between the substrate holding electrode and the high frequency application electrode is decomposed by glow discharge generated by a high frequency power applied between the two electrodes, so that a thin film is deposited on the heated substrate, the plasma CVD device comprising:
      a first electrode heater installed along a peripheral portion of the high frequency application electrode, and heating the peripheral portion of the high frequency application electrode; and
      a second metallic electrode heater which is composed of a bottom portion and a side portion provided uprightly along a peripheral edge of the bottom portion and formed into a concave shape in section, and which surrounds the high frequency application electrode with a spacing therebetween, and which heats a surface of the high frequency application electrode opposite to its surface facing the substrate as well as the peripheral portion of the high frequency application electrode.

2. The plasma CVD device according to claim 1, wherein the high frequency application electrode is formed into a rectangular plate shape rounded at four corners; and the bottom portion of the second metallic electrode heater has a size larger than that of the high frequency application electrode and is formed into a rectangular plate shape rounded at four corners.

3. The plasma CVD device according to claim 1, wherein the high frequency application electrode is formed into a disc shape; and the bottom portion of the second metallic electrode heater is formed into a disc shape having a size larger than that of the high frequency application electrode.

4. The plasma CVD device according to claim 1, wherein the first electrode heater and the second metallic electrode heater can each have a 100° C. or higher temperature and heat the high frequency application electrode to 100° C. or higher.

5. The plasma CVD device according to claim 1, wherein the first electrode heater is removable from the high frequency application electrode.

* * * * *